United States Patent
Gadkaree

(10) Patent No.: US 7,410,883 B2
(45) Date of Patent: Aug. 12, 2008

(54) GLASS-BASED SEMICONDUCTOR ON INSULATOR STRUCTURES AND METHODS OF MAKING SAME

(75) Inventor: Kishor Purushottam Gadkaree, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 504 days.

(21) Appl. No.: 11/159,889

(22) Filed: Jun. 23, 2005

(65) Prior Publication Data
US 2006/0234477 A1  Oct. 19, 2006

(51) Int. Cl.
*H01L 21/46* (2006.01)
(52) U.S. Cl. ............... 438/455; 438/458; 257/E21.122
(58) Field of Classification Search .............. 438/455, 438/458; 257/E21.122
See application file for complete search history.

(56) References Cited

U.S. PATENT DOCUMENTS

| | | | |
|---|---|---|---|
| 5,811,348 A | 9/1998 | Matsushita et al. | 438/455 |
| 5,854,123 A | 12/1998 | Sato et al. | 438/507 |
| 5,856,229 A | 1/1999 | Sakaguchi et al. | 438/406 |
| 5,876,497 A | 3/1999 | Atoji | 117/85 |
| 6,100,165 A | 8/2000 | Sakaguchi et al. | 438/455 |
| 6,107,213 A | 8/2000 | Tayanaka | 438/762 |
| 6,143,628 A | 11/2000 | Sato et al. | 438/455 |
| 6,143,629 A | 11/2000 | Sato | 438/455 |
| 6,376,337 B1 | 4/2002 | Lofgren et al. | 438/478 |
| 6,410,436 B2 | 6/2002 | Yamagata et al. | 438/689 |
| 6,426,274 B1 | 7/2002 | Tayanaka | 438/928 |
| 6,566,235 B2 | 5/2003 | Nishida et al. | 438/458 |
| 2002/0016067 A1* | 2/2002 | Yamagata et al. | 438/689 |

* cited by examiner

*Primary Examiner*—Bradley K Smith
(74) *Attorney, Agent, or Firm*—Timothy M. Schaeberle

(57) ABSTRACT

Methods and apparatus provide for: a semiconductor wafer; at least one porous layer in the semiconductor wafer; an epitaxial semiconductor layer directly or indirectly on the porous layer; and a glass substrate bonded to the epitaxial semiconductor layer via electrolysis.

27 Claims, 7 Drawing Sheets

FIG. 2

202 CREATE A FIRST LAYER OF FINE PORES ON A SURFACE OF A SINGLE CRYSTAL SILICON WAFER

204 CREATE A SECOND LAYER OF LARGER PORES BELOW THE FIRST LAYER OF THE SILICON WAFER

206 SUBJECT THE FIRST LAYER OF PORES TO MILD OXIDATION

207 ANNEAL FIRST LAYER IN HYDROGEN ATMOSPHERE

208 FORM AN EPITAXIAL SINGLE CRYSTAL SILICON LAYER ON THE OXIDIZED FIRST POROUS LAYER

210 BOND THE EPITAXIAL SILICON LAYER TO A GLASS SUBSTRATE USING ELECTROLYSIS

212 SEPARATE THE SILICON WAFER AND THE SECOND POROUS LAYER FROM THE REMAINING LAYERS

GLASS-BASED SEMICONDUCTOR ON INSULATOR STRUCTURES AND METHODS OF MAKING SAME

BACKGROUND

The present invention relates to semiconductor-on-insulator (SOI) structures and methods for making same.

To date, the semiconductor material most commonly used in semiconductor-on-insulator structures has been silicon. Such structures have been referred to in the literature as silicon-on-insulator structures and the abbreviation "SOI" has been applied to such structures. Silicon-on-insulator technology is becoming increasingly important for high performance thin film transistors, solar cells, and displays, such as, active matrix displays. Silicon-on-insulator wafers consist of a thin layer of substantially single crystal silicon (generally 0.1-0.3 microns in thickness but, in some cases, as thick as 5 microns) on an insulating material.

For ease of presentation, the following discussion will at times be in terms of silicon-on-insulator structures. The references to this particular type of semiconductor-on-insulator structure are made to facilitate the explanation of the invention and are not intended to, and should not be interpreted as, limiting the invention's scope in any way. The SOI abbreviation is used herein to refer to semiconductor-on-insulator structures in general, including, but not limited to, silicon-on-insulator structures. Similarly, the SOG abbreviation is used to refer to semiconductor-on-glass structures in general, including, but not limited to, silicon-on-glass structures. The SOG nomenclature is also intended to include semiconductor-on-glass-ceramic structures, including, but not limited to, silicon-on-glass-ceramic structures. The abbreviation SOI encompasses SOG structures.

Various ways of obtaining SOI structures wafer include epitaxial growth of Si on lattice matched substrates. An alternative process includes the bonding of a single crystal silicon wafer to another silicon wafer on which an oxide layer of $SiO_2$ has been grown, followed by polishing or etching of the top wafer down to, for example, a 0.1 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

The former two methods have not resulted in satisfactory structures in terms of cost and/or bond strength and durability. The latter method involving hydrogen ion implantation has received some attention and has been considered advantageous over the former methods because the implantation energies required are less than 50% of that of oxygen ion implants and the dosage required is two orders of magnitude lower.

Exfoliation by the hydrogen ion implantation method typically consists of the following steps. A thermal oxide layer is grown on a single crystal silicon wafer. Hydrogen ions are then implanted into this wafer to generate subsurface flaws. The implantation energy determines the depth at which the flaws are generated and the dosage determines flaw density. This wafer is then placed into contact with another silicon wafer (the support substrate) at room temperature to form a tentative bond. The wafers are then heat-treated to about 600 degrees C. to cause growth of the subsurface flaws for use in separating a thin layer of silicon from the Si wafer. The resulting assembly is then heated to a temperature above 1,000 degrees C. to fully bond the Si film with $SiO_2$ underlayer to the support substrate, i.e., the unimplanted Si wafer. This process thus forms an SOI structure with a thin film of silicon bonded to another silicon wafer with an oxide insulator layer in between.

Cost is an important consideration for commercial applications of SOI structures. To date, a major part of the cost of the above-described method and structure has been the cost of the silicon wafer which supports the oxide layer, topped by the Si thin film, i.e., a major part of the cost has been the support substrate. Although the use of quartz as a support substrate has been mentioned in various patents (see U.S. Pat. Nos. 6,140,209 6,211,041, 6,309,950, 6,323,108, 6,335,231, and 6,391,740), quartz is itself a relatively expensive material. In discussing support substrates, some of the above references have mentioned quartz glass, glass, and glass-ceramics. Other support substrate materials listed in these references include diamond, sapphire, silicon carbide, silicon nitride, ceramics, metals, and plastics.

U.S. Pat. No. 5,374,564 discloses a process to obtain a single crystal silicon film on a substrate using a thermal process. A semiconductor material wafer having a planar face is subject to the following steps: (i) implantation by bombardment of a face of the wafer by means of ions creating a layer of gaseous micro-bubbles defining a lower region constituting the mass of the substrate and an upper region constituting the thin film; (ii) contacting the planar face of the wafer with a stiffener constituted by at least one rigid material layer; and (iii) a third stage of heat treating the assembly of the wafer and the stiffener at a temperature above that at which the ion bombardment was carried out and sufficient to create a pressure effect in the micro-bubbles and a separation between the thin film and the mass of the substrate. Due to the high temperature steps, this process does not work with lower cost glass or glass-ceramic substrates.

U.S. Patent Application No.: 2004/0229444 discloses a process that produces a SOG structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; and (iv) cooling the structure to a common temperature to facilitate separation of the glass substrate and a thin layer of silicon from the silicon wafer. While this process has significant advantages over the other methods in the art, the ion implantation step introduces what may be significant costs into the process.

It has bee discovered, however, that a more economical approach to producing known and novel SOI structures may be achieved according to various embodiments of the present invention.

SUMMARY OF THE INVENTION

In accordance with one or more embodiments of the present invention, a method of forming a semiconductor on glass structure includes: creating at least one porous layer in a semiconductor wafer; partial oxidation to stabilize the process structure, followed by annealing in hydrogen to smooth the first layer and Si injection during the hydrogen anneal to reduce surface defects; forming an epitaxial semiconductor layer directly or indirectly on the porous layer; bonding a glass substrate to the epitaxial semiconductor layer; and applying stress to at least the porous layer such that the bonded glass substrate and epitaxial semiconductor layer separates from the semiconductor wafer.

Preferably, the porous layer includes first and second porous layers in the semiconductor wafer, the second layer being below the first layer and including at least mostly larger pores than the first layer.

The step of creating the first and second porous layers may include an anodization process in which the semiconductor wafer is immersed into a solution and a current is induced to flow between the semiconductor wafer and another electrode such that the first porous layer is formed via electrochemical etching. The amplitude of the current is then increased such that the second porous layer is formed below the first layer. The solution may include an HF, ethanol and water solution and the semiconductor wafer is used an anode electrode. The other electrode may be taken from the group consisting of a semiconductor electrode, a silicon electrode, a platinum electrode, and a noble metal electrode. The magnitude of the current is preferably in the range of between about 1 ma to about 10 ma per square centimeter to produce the first porous layer. The current to form the first porous layer is preferably applied for a period of less than about two hours. It is preferred that the pores of the first porous layer are of a nm scale. A maximum increase in the magnitude of the current is preferably from about 2 to about 4 to produce the second porous layer.

The method may further include oxidizing the pores of the first porous layer prior to forming the epitaxial semiconductor layer. The oxidizing step is preferably dry oxidation at a temperature of about 350 to about 500 degrees C.

The method may further include hydrogen annealing of the porous structure between the temperatures of 900-1250 degrees C. The annealing step preferably smoothens the first porous layer. During this step a small fraction of silicon may be introduced in gaseous form to minimize surface defects.

The epitaxial semiconductor layer may be formed via one or more of: chemical vapor deposition, sputtering, e-beam evaporation, and thermal evaporation of silicon.

The method may further include bonding the glass substrate to the epitaxial semiconductor layer using electrolysis. This may include applying heating to at least one of the glass substrate and the epitaxial semiconductor layer; bringing the glass substrate into direct or indirect contact with the epitaxial semiconductor layer; and applying a voltage potential across the glass substrate and the epitaxial semiconductor layer to induce the bond therebetween. The temperature of the glass substrate and the epitaxial semiconductor layer are preferably elevated to within about 150 degrees C. of the strain point of the glass substrate. The voltage potential across the glass substrate and the epitaxial semiconductor layer is preferably between about 100 to 2000 volts.

The stress may be induced by cooling the bonded glass substrate, epitaxial semiconductor layer, porous layers and semiconductor wafer such that a fracture occurs substantially at the first and second porous layers. Alternatively or in addition, mechanical stress may be used to facilitate or augment the separation. For example, one possible method of introducing mechanical stress includes using water jet separation techniques. Preferably, the separation results in a structure including the glass substrate, the epitaxial semiconductor layer and at least a portion of the first porous layer. The first porous layer may be polished off to form the semiconductor on glass structure.

It is noted that the semiconductor of at least one of the semiconductor wafer and the epitaxial semiconductor layer may be taken from the group consisting of: silicon (Si), germanium-doped silicon (SiGe), silicon carbide (SiC), germanium (Ge), gallium arsenide (GaAs), GaP, and InP.

In accordance with preferred embodiments, a process to obtain a thin single crystal silicon film on glass comprises the following steps. A porous surface is created in a single crystal silicon wafer via anodization. For example, the single crystal silicon wafer preferably exhibits a resistivity between about 0.001 ohm·cm to about 100 ohm·cm and is dipped in a solution of HF, ethanol and water (or other appropriate electrolyte), and electric potential applied with the silicon wafer as the anode. By controlling the current density, nanometer scale porosity is created on the surface of the wafer. After a porous layer with fine porosity is created, the current density is increased for a time period so that another porous layer with increased pore size is created below the first fine pore layer. The structure of silicon is controlled by the concentration of solution, the current density and resistivity of silicon. The thickness of the porous silicon layer is controlled by the length of time the process is carried out.

After creating the first and second porous layers, the silicon wafer is removed from the electrolyte bath and washed and cleaned. The wafer is then subjected to oxide growth in air at about 400 degrees C. to create about a 1 to 3 nanometer layer of oxide inside the pores. This stabilizes the pore structure so that subsequent high temperature heat treatment does not result in collapse of pore structure.

The wafer is then annealed in a hydrogen-containing atmosphere at a temperature range of between 900-1200° C. (preferably 1000-1100 degrees C.) to reduce surface roughness. Additionally, silicon may be introduced in the form of a gas (e.g., a gaseous precursor such as $SiH_4$) during this annealing step to further reduce defects.

Next, an epitaxial layer of silicon is created via CVD, sputtering, e-beam evaporation or thermal evaporation of silicon. The thickness of the epitaxial layer may be anywhere between about 5 nm to about 10 microns or more depending on application. This epitaxial silicon layer is preferably a single crystal layer.

A glass substrate is cleaned using any of the standard techniques. This substrate is then brought in contact with epitaxial silicon layer and taken to a temperature within about +/−150 degrees C. of the strain point of the glass. Next, voltage, temperature and pressure is applied to create a strong bond between the glass substrate and the epitaxially grown silicon wafer and at the same time creates a barrier layer in glass free of mobile ions. The bonding process may be carried out in a vacuum, air, nitrogen or other inert atmosphere.

Next the two wafers are separated via fracture of the large pore second layer via thermal stresses or via mechanical stresses such as water jet cutting or chemical etching. After separation of the wafers the remaining porous silicon layer on the epitaxially grown silicon layer may be removed via polishing techniques.

The silicon wafer may be reused to produce further SiOG structures.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIG. 2 is a flow diagram illustrating process steps that may be carried out to produce the SOI structure of FIG. 1;

DETAILED DESCRIPTION OF THE PRESENT INVENTION

Figure 1:
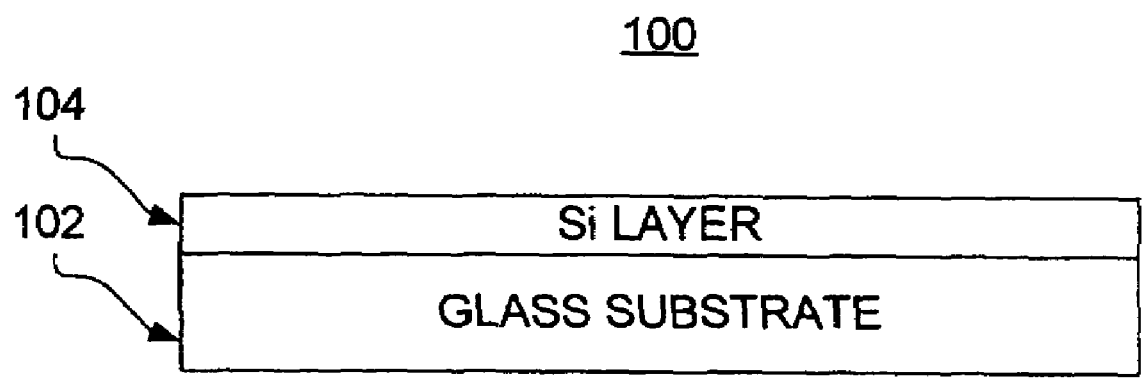
FIG. 1 is a block diagram illustrating the structure of a SOI device in accordance with one or more embodiments of the present invention.

With reference to the drawings, wherein like numerals indicate like elements, there is shown in FIG. 1 an SOG structure 100 in accordance with one or more embodiments of the present invention. The SOG structure 100 preferably includes a glass substrate 102 and a semiconductor layer 104. The SOG structure 100 has suitable uses in connection with fabricating thin film transistors (TFTs), e.g., for display applications, including organic light-emitting diode (OLED) displays and liquid crystal displays (LCDs), integrated circuits, photovoltaic devices, etc.

The semiconductor material of the layer 104 is preferably in the form of a substantially single-crystal material. The word "substantially" is used in describing the layer 104 to take account of the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

For the purposes of discussion, it is assumed that the semiconductor layer 102 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

The glass substrate 102 is preferably formed from an oxide glass or an oxide glass-ceramic. Although not required, the embodiments described herein preferably include an oxide glass or glass-ceramic exhibiting a strain point of less than about 1,000 degrees C. As is conventional in the glass making art, the strain point is the temperature at which the glass or glass-ceramic has a viscosity of $10^{14.6}$ poise ($10^{13.6}$ Pa·s). As between oxide glasses and oxide glass-ceramics, the glasses are presently preferred because they are typically simpler to manufacture, thus making them more widely available and less expensive.

By way of example, the glass substrate 102 may be formed from glass substrates containing alkaline-earth ions, such as, substrates made of CORNING INCORPORATED GLASS COMPOSITION NO. 1737 or CORNING INCORPORATED GLASS COMPOSITION NO. EAGLE 2000™. These glass materials have particular use in, for example, the production of liquid crystal displays.

The glass substrate preferably has a thickness in the range of about 0.1 mm to about 10 mm and most preferably in the range of about 0.5 mm to about 1 mm. For some SOI structures, insulating layers having a thickness greater than or equal to about 1 micron are desirable, e.g., to avoid parasitic capacitive effects which arise when standard SOI structures having a silicon/silicon dioxide/silicon configuration are operated at high frequencies. In the past, such thicknesses have been difficult to achieve. In accordance with the present invention, an SOI structure having an insulating layer thicker than about 1 micron is readily achieved by simply using a glass substrate 102 having a thickness that is greater than or equal to about 1 micron. A preferred lower limit on the thickness of the glass substrate 102 is thus about 1 micron.

In general, the glass substrate 102 should be thick enough to support the semiconductor layer 104 through the process steps of the invention, as well as subsequent processing performed on the SOG structure 100. Although there is no theoretical upper limit on the thickness of the glass substrate 102, a thickness beyond that needed for the support function or that desired for the ultimate SOG structure 100 is generally not preferred since the greater the thickness of the glass substrate 102, the more difficult it will be to accomplish at least some of the process steps in forming the SOG structure 100.

The oxide glass or oxide glass-ceramic substrate 102 is preferably silica-based. Thus, the mole percent of $SiO_2$ in the oxide glass or oxide glass-ceramic is preferably greater than 30 mole % and most preferably greater than 40 mole %. In the case of glass-ceramics, the crystalline phase can be mullite, cordierite, anorthite, spinel, or other crystalline phases known in the art for glass-ceramics. Non-silica-based glasses and glass-ceramics may be used in the practice of one or more embodiments of the invention, but are generally less preferred because of their higher cost and/or inferior performance characteristics. Similarly, for some applications, e.g., for SOI structures employing semiconductor materials that are not silicon-based, glass substrates which are not oxide based, e.g., non-oxide glasses, may be desirable, but are generally not preferred because of their higher cost.

For certain applications, e.g., display applications, the glass or glass-ceramic 102 is preferably transparent in the visible, near UV, and/or IR wavelength ranges, e.g., the glass or glass ceramic 102 is preferably transparent in the 350 nm to 2 micron wavelength range.

Although the glass substrate 102 is preferably composed of a single glass or glass-ceramic, laminated structures can be used if desired. When laminated structures are used, the layer of the laminate closest to the semiconductor layer 104 preferably has the properties discussed herein for a glass substrate 102 composed of a single glass or glass-ceramic. Layers farther from the semiconductor layer 104 preferably also have those properties, but may have relaxed properties because they do not directly interact with the semiconductor layer 104. In the latter case, the glass substrate 102 is considered to have ended when the properties specified for a glass substrate 102 are no longer satisfied.

Reference is now made to FIGS. 2 and 3A-C, which illustrate process steps that may be carried out in order to produce an intermediate structure in connection with fabricating the SOG structure 100 of FIG. 1. At action 202, which refers to FIG. 3A, a first porous layer 122 of relatively fine pores is formed on a surface of a semiconductor wafer 120. For the purposes of discussion, the semiconductor wafer 120 is preferably a substantially single crystal Si wafer, although as discussed above any other suitable semiconductor conductor material may be employed.

The first porous layer 122 is preferably produced via anodization, which is an electrochemical etching process. The semiconductor wafer 120 is immersed in a suitable electrolyte solution and used as one electrode of a pair. By way of example, the solution may include HF, ethanol, and water. Any other appropriate electrolyte may be employed as will be apparent to those of skill in the art from the description herein. The other electrode may be formed from any suitable material, such as a corresponding semiconductor material (e.g., silicon), platinum, a noble metal, or any other suitable metal or conductive material.

A voltage is applied across the electrodes, preferably with the potential such that the semiconductor wafer 120 operates as an anode. The magnitude of the voltage is preferably adjusted to create a suitable current through the semiconductor wafer 120, electrolyte solution, and other electrode in order to induce electrochemical etching of the surface of the semiconductor wafer 120. The current density is preferably in the range of about 1 mA to about 10 mA per centimeter squared. By way of example, the voltage may be applied for less than about two hours in order to achieve the desired porosity and depth of the first porous layer 122. It is preferred that the pores created utilizing the anodization process are on the nm scale, for example, the pores of the first porous layer 122 may be between about 2 to 5 nm.

Figure 3A:
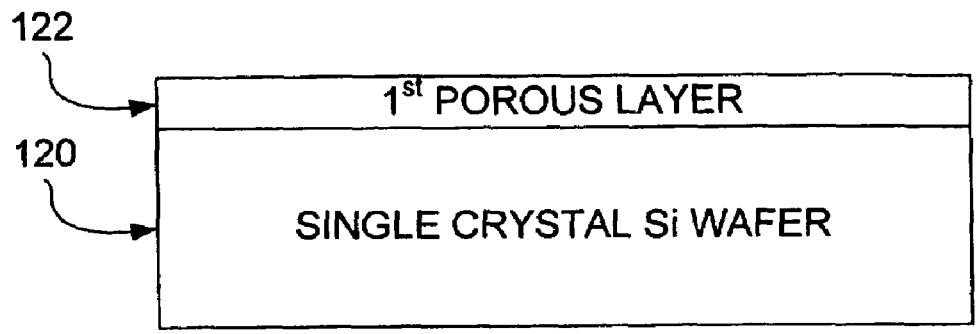
FIGS. 3A-C are block diagrams illustrating a process of forming an intermediate structure in connection with forming the SOI structure of FIG. 1.
Figure 3B:
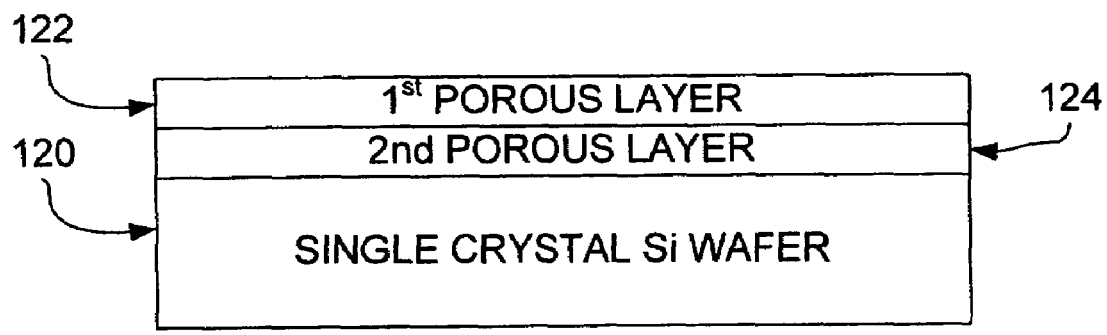

At action 204, which refers to FIG. 3B, a second porous layer 124 is preferably created below the first porous layer 122 such that the pores of the second porous layer 124 are relatively larger than the pores of the first porous layer 122. This is preferably accomplished by increasing the current density of the anodization process in order to create increased pore sizes below the first porous layer 122. By way of example, the current may be increased by about 2 to about 4 times the amplitude of the current density when forming the first porous layer 122. By way of example, the pores of the second porous layer 124 may be between about 10 to 20 nm. As will be discussed later in this specification, the relatively larger pores of the second porous layer 124 may provide an area of weakness along which exfoliation may take place.

Those skilled in the art will appreciate that the current amplitude, electrolyte concentration, resistivity of the electrodes and solution, and time of application are variables in connection with achieving particular pore sizes, pore densities, and layer thicknesses. By way of example, the thickness of the second porous layer may be about the same thickness as the first porous layer 122. Thus, for example, the increased current level may be applied for less than about two hours in order to form the second porous layer 124. It is understood, however, that other amounts of time may be necessary depending on the variables discussed above.

Although the invention is not limited to any theory of operation, it is noted that the first porous layer 122 preferably provides two functions. First, it provides an access mechanism through which the second porous layer 124 may be formed using the anodization process described above. Second, the first porous layer provides a quality of porosity on which at least one further process layer may be disposed. Indeed, as will be discussed below, the smaller pores of the first porous layer 122 may be desirable in some applications in order to facilitate deposition of an epitaxially disposed layer of semiconductor material.

At action 206, the semiconductor wafer 120 is preferably washed and cleaned and the first porous layer 122 is preferably subject to mild oxidation. Preferably, the oxidation is a dry process in which the semiconductor wafer 120 is heated to a temperature of about 350 to about 500 degrees C. such that a relatively thin layer of oxide is formed within the pores of the first porous layer 122. It is noted that the elevated temperature should not be so high as to collapse the pore structure of the first porous layer 122. Preferably, the thickness of the oxide layer is from about 1 nm to about 3 nm. Although it is possible to employ oxide layers of greater than about 1 nm to about 3 nm in thickness, it is believed that oxide thicknesses greater than about 10 nm or 100 nm may have a negative impact on a bonding process discussed later in this description. By way of brief discussion, however, it is believed that an oxide layer having a thickness in the 10 nm range, the 100 nm range or greater would introduce a relatively high resistance to current flow, which current flow is a desirable property in connection with the bonding process discussed below.

At action 207, the wafer 120 is preferably annealed in an atmosphere that is conducive to reducing the surface roughness of the first porous layer 122. For example, a hydrogen-containing atmosphere may be employed at a temperature range of between about 900 to about 1250 degrees C., preferably between about 1000 to about 1100 degrees C., to reduce the surface roughness of the first porous layer 122. Those skilled in the art will appreciate that elements other than hydrogen may be employed in addition, or in the alternative, during the annealing step. Further, other temperature ranges may be employed, although those stated above are believed more desirable. Silicon is preferably introduced during the annealing step. For example, when a hydrogen environment is employed, silicon may be introduced in the form of a gas (e.g., a gaseous precursor such as $SiH_4$) to further reduce (and preferably minimize) surface defects.

Although the invention is not limited to any theory of operation, it is noted that the oxidation and annealing steps may be performed in order to prepare the fist porous layer 122 for accepting an epitaxially disposed layer of semiconductor material (action 208), which will be discussed below. Preferably, the oxidation and annealing steps clean and improve the quality of the surface of the first porous layer 122 and improve the ease of deposition and quality of the epitaxial layer. It is also noted that the relatively small size of the pores of the first porous layer 122 also contribute significantly to the ease of deposition and quality of the epitaxial layer.

Figure 3C:
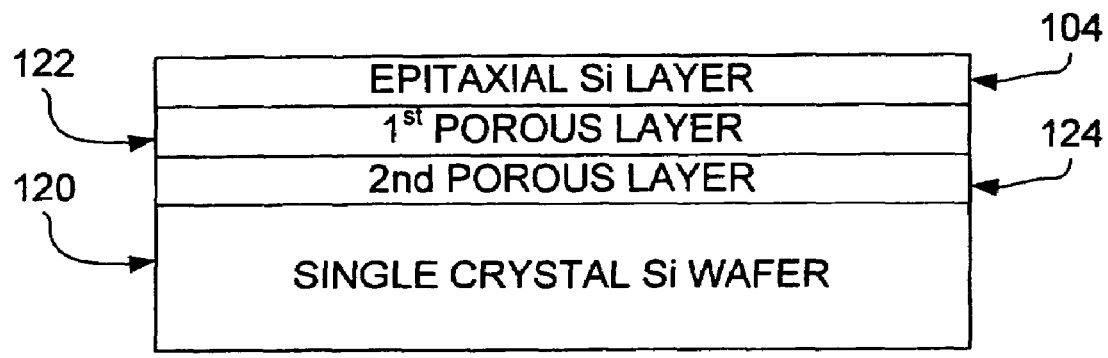

At action 208, which refers to FIG. 3C, an epitaxial semiconductor layer 104 is preferably formed directly or indirectly on the first porous layer 122. In keeping with the example hereinabove, the epitaxial layer 104 is preferably a silicon layer, although other semiconductor materials may be employed. The epitaxial silicon layer 104 is preferably created via chemical vapor deposition, sputtering, e-beam evaporation, thermal evaporation, or other suitable processes. Preferably, the epitaxial silicon layer 104 is of a substantially single crystal structure. By way of example, a chemical vapor deposition process may be accomplished via SiH2Cl2/H2 as a source gas with film growth in the temperature range of between about 800 to about 1,000 degrees C., preferably between about 900 to about 950 degrees C. Utilizing this process, a suitable epitaxial silicon layer 104 may be built up in about 30 minutes or less.

The thickness of the epitaxial silicon layer 104 may be between about 5 nm to about 10 microns (10,000 nm), although other thicknesses including greater thicknesses may be employed depending on the particular application of the structure 100.

Figure 4:
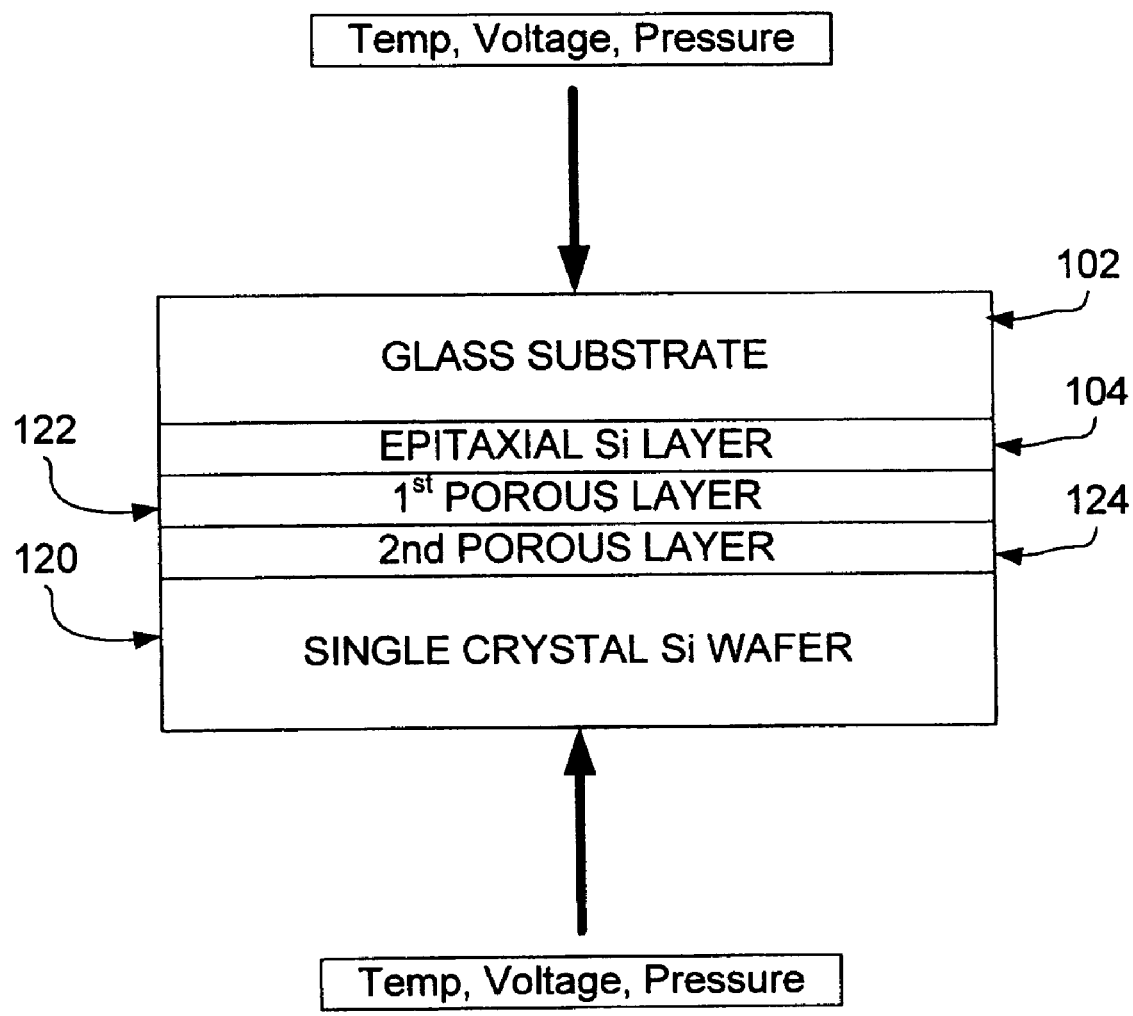
FIG. 4 is a block diagram illustrating a process of bonding a glass substrate to the intermediate structure of FIG. 3.

At action 210, the glass substrate 102 is preferably bonded to the epitaxial semiconductor layer 104 using an electrolysis process. The electrolysis process is discussed in more detail with reference to FIG. 4. A preferred electrolysis bonding process is described in U.S. Patent Application No. 2004/0229444, the entire disclosure of which is hereby incorporated by reference. Portions of this process are discussed below.

As an initial step, the glass substrate 102 is cleaned and any suitable surface preparation steps are carried out. Then the glass substrate is brought into contact with the epitaxial semiconductor layer 104. Prior to or after the contact, the semiconductor wafer-epitaxial layer structure (the "wafer 120" for short) and the glass substrate 102 are heated under a differential temperature gradient. Preferably the glass substrate 102 is heated to a higher temperature than the semiconductor wafer 120. By way of example, the temperature difference between the glass substrate 102 and the semiconductor wafer 120 is at least 10 degrees C., although the difference may be as high as about 100 to about 150 degrees C. This temperature differential is desirable for a glass having a coefficient of thermal expansion (CTE) matched to that of silicon since it facilitates later separation of the epitaxial layer 104 from the semiconductor wafer 120 due to thermal stresses.

Once the temperature differential between the glass substrate 102 and the semiconductor wafer 120 is stabilized, any spacers may be removed and mechanical pressure is applied to the intermediate assembly. The preferred pressure range is between about 1 to about 50 psi. Application of higher pressures, e.g., pressures above 100 psi, might cause breakage of the glass wafer.

The glass substrate 102 and the semiconductor wafer 120 are preferably taken to a temperature within about +/−150 degrees C. of the strain point of the glass substrate 102.

Next, a voltage is applied across the intermediate assembly, preferably with the semiconductor wafer 120 at the positive electrode and the glass substrate 102 the negative electrode. The application of the voltage potential causes alkali or alkaline earth ions in the glass substrate 102 to move away from the semiconductor/glass interface further into the glass substrate 102. This accomplishes two functions: (i) an alkali or alkaline earth ion free interface is created; and (ii) the glass substrate 102 becomes very reactive and bonds to the epitaxial semiconductor layer 104 strongly with the application of heat at relatively low temperatures.

At action 212, after the intermediate assembly is held under these conditions for some time (e.g., approximately 1 hr or less), the voltage is removed and the intermediate assembly is allowed to cool to room temperature. The semiconductor wafer 120 and the glass substrate 102 are then separated, which may include some peeling if they have not already become completely free, to obtain a glass substrate 102 with a thin epitaxially grown semiconductor layer 104 bonded thereto.

The separation is preferably accomplished via fracture of the larger pores of the second layer 124 due to thermal stresses. Alternatively or in addition, mechanical stresses such as water jet cutting or chemical etching may be used to facilitate the separation.

Figure 5:
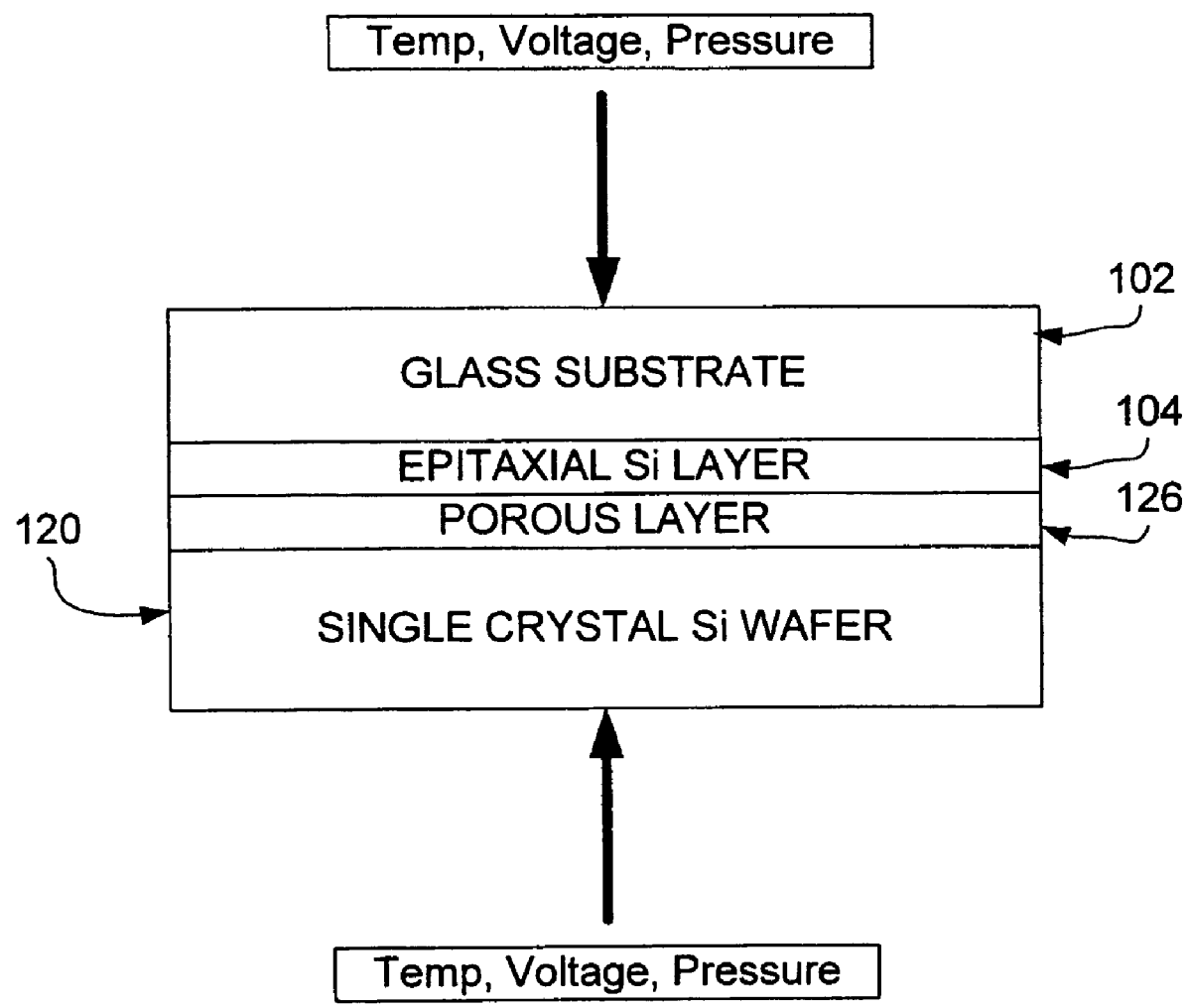
FIG. 5 is a block diagram illustrating a process of bonding a glass substrate to an alternative embodiment of an intermediate structure.

With reference to FIG. 5, and in accordance with one or more further embodiments of the present invention, a single porous layer 126 may be employed in fabricating the intermediate structure before bonding same to the glass substrate 102. In this regard, steps 202 and 204 of FIG. 2 would be substituted with similar actions in connection with forming the single porous layer 126 using anodization on the surface of the semiconductor wafer 120. It is preferred that the pores created utilizing the anodization process are on the nm scale, for example, the pores of the porous layer 126 may have a size of about 7 nm (e.g., between about 6 to 9 nm) While smaller sized pores may be desirable in some applications, a single porous layer 126 having intermediate sized pores (e.g., about 7 nm) may be suitable for supporting the epitaxial growth of the semiconductor layer 104, particularly after oxidation and annealing (steps 206 and 207). As with prior embodiments of the invention, the glass substrate 102 is preferably bonded to the epitaxial semiconductor layer 104 using the electrolysis process discussed above. It is noted that, while large pore sizes facilitate ease of separation, the intermediate sized pores may also achieve suitable separation. Advantageously, the single porous layer approach simplifies at least some portions of the process.

Figure 6A:
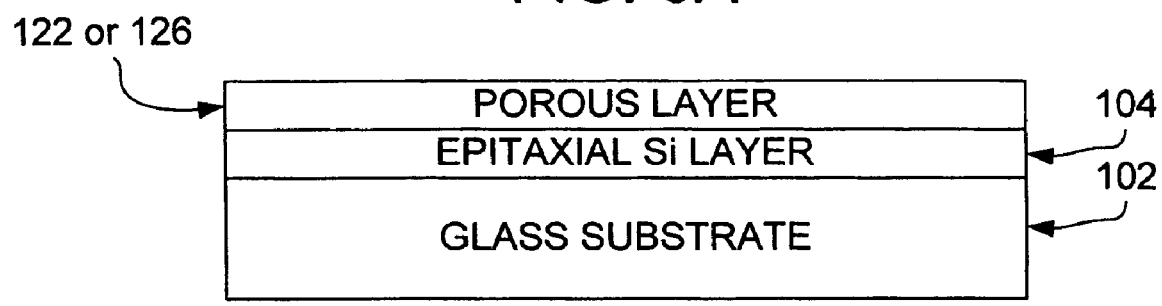
FIGS. 6A-B are block diagrams illustrating a process of separating certain layers of the intermediate structure of FIG. 4 in connection with forming the SOI structure of FIG. 1.
Figure 6B:
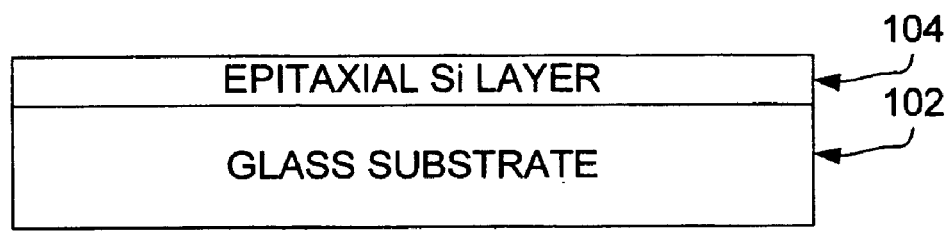

As illustrated in FIG. 6A, after separation, the resulting structure may include the glass substrate 102, the epitaxial semiconductor layer 104 bonded thereto, and at least a portion of the porous layer(s). When a two porous layer structure is employed, the separation may take place along at least one of the first and second porous layers 122, 124. When a single porous layer 126 is employed, separation may take place within or closely adjacent the layer 126. Any remaining porous semiconductor layer(s) may be removed via polishing techniques, e.g., via CMP or other techniques known in the art to obtain the single crystal silicon layer 104 on the glass substrate 102 (FIG. 6B).

It is noted that the semiconductor wafer 120 may be reused to continue producing other SOG structures 100.

Figure 7:
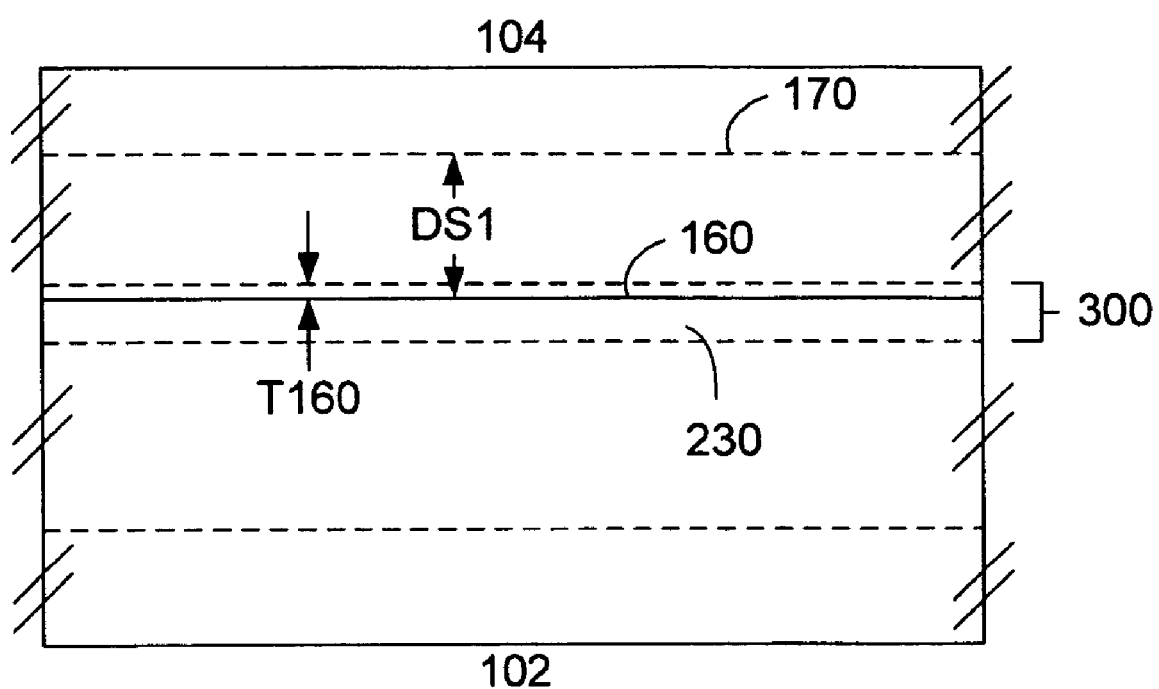
FIG. 7 is a more detailed block diagram illustrating the bonding interface between the glass substrate and the silicon layer of the SOI structure of FIG. 1.

With reference to FIG. 7, some structural details of the SOG structure 100, particularly at the interface of the epitaxially disposed semiconductor layer 102 and the glass substrate 102 are now described. The bonding process (action 210) transforms the interface between the epitaxially disposed semiconductor layer 102 and the glass substrate 102 into an interface region 300. The interface region 300 preferably comprises a hybrid region 160 and a depletion region 230. The interface region 300 may also include one or more positive ion pile-up regions in the vicinity of the distal edge of the depletion region 230.

The hybrid region 160 is of enhanced oxygen concentration of thickness T160. This thickness may be defined in terms of a reference concentration for oxygen at a reference surface 170 within the epitaxial semiconductor layer 104. The reference surface 170 is substantially parallel to the bonding surface between the glass substrate 102 and the epitaxial semiconductor layer 104 and is separated from that surface by a distance DS1. Using the reference surface 170, the thickness T160 of the hybrid region 160 will typically satisfy the relationship:

$$T160 \leq 200 \text{ nm},$$

where T160 is the distance between bonding surface and a surface which is: (i) substantially parallel to bonding surface, and (ii) is the surface farthest from bonding surface for which the following relationship is satisfied:

$$CO(x)\text{-}CO/Ref \geq 50 \text{ percent}, 0 \leq x \leq T160,$$

where CO(x) is the concentration of oxygen as a function of distance x from the bonding surface, CO/Ref is the concentration of oxygen at the above reference surface 170, and CO(x) and CO/Ref are in atomic percent.

Typically, T160 will be substantially smaller than 200 nanometers, e.g., on the order of about 50 to about 100 nanometers. It should be noted that CO/Ref will typically be zero, so that the above relationship will in most cases reduce to:

$$CO(x) \geq 50 \text{ percent}, 0 \leq x \leq T160.$$

In connection with the depletion region 230, the oxide glass or oxide glass-ceramic substrate 102 preferably comprises at least some positive ions that move in the direction of the applied electric field, i.e., away from the bonding surface and into the glass substrate 102. Alkali ions, e.g., $Li^{+1}$, $Na^{+1}$, and/or $K^{+1}$ ions, are suitable positive ions for this purpose because they generally have higher mobilities than other types of positive ions typically incorporated in oxide glasses and oxide glass-ceramics, e.g., alkaline-earth ions. However, oxide glasses and oxide glass-ceramics having positive ions other than alkali ions, e.g., oxide glasses and oxide glass-ceramics having only alkaline-earth ions, can be used in the practice of the invention. The concentration of the alkali and alkaline-earth ions can vary over a wide range, representative concentrations being between 0.1 and 40 wt. % on an oxide basis. Preferred alkali and alkaline-earth ion concentrations are 0.1 to 10 wt. % on an oxide basis in the case of alkali ions, and 0-25 wt. % on an oxide basis in the case of alkaline-earth ions.

The electric field applied in the bonding step (action 210) moves the positive ions (cations) further into the glass substrate 102 forming the depletion region 230. The formation of the depletion region 230 is especially desirable when the oxide glass or oxide glass-ceramic contains alkali ions, since such ions are known to interfere with the operation of semiconductor devices. Alkaline-earth ions, e.g., $Mg^{+2}$, $Ca^{+2}$, $Sr^{+2}$, and/or $Ba^{+2}$, can also interfere with the operation of semiconductor devices and thus the depletion region also preferably has reduced concentrations of these ions.

It has been found that the depletion region 230 once formed is stable over time even if the SOG structure 100 is heated to an elevated temperature comparable to, or even to some extent higher than, that used in the bonding process. Having been formed at an elevated temperature, the depletion region 230 is especially stable at the normal operating and formation temperatures of SOG structures. These considerations ensure that alkali and alkaline-earth ions will not diffuse back from the oxide glass or oxide glass-ceramic 102 into the semiconductor material 104 during use or further device processing, which is an important benefit derived from using an electric field as part of the bonding process.

As with selecting the operating parameters to achieve a strong bond, the operating parameters needed to achieve a depletion region 230 of a desired width and a desired reduced positive ion concentration for all of the positive ions of concern can be readily determined by persons skilled in the art from the present disclosure. When present, the depletion region 230 is a characteristic feature of an SOG structure 100 produced in accordance with one or more embodiments of the present invention.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a semiconductor on glass structure, comprising:
   creating first and second porous layers in a semiconductor wafer, the second layer being below the first layer and including at least mostly larger pores than the first layer;
   forming an epitaxial semiconductor layer directly or indirectly on the first porous layer;
   bonding a glass substrate to the epitaxial semiconductor layer using electrolysis; and
   applying stress to at least one of the first and second porous layers such that the bonded glass substrate and epitaxial semiconductor layer separates from the semiconductor wafer.

2. The method of claim 1, wherein the step of creating the first and second porous layers includes:
   immersing the semiconductor wafer into a solution and inducing a current to flow between the semiconductor wafer and another electrode such that the first porous layer is formed via electrochemical etching; and
   increasing an amplitude of the current such that the second porous layer is formed below the first layer.

3. The method of claim 2, wherein the solution includes an HF and an electrolyte solution and the semiconductor wafer is used an anode electrode.

4. The method of claim 3, wherein the other electrode is taken from the group consisting of a semiconductor electrode, a silicon electrode, a platinum electrode, and a noble metal electrode.

5. The method of claim 2, wherein the magnitude of the current is in the range of between about 1 ma to about 10 ma per square centimeter to produce the first porous layer.

6. The method of claim 2, wherein a resistivity of the semiconductor wafer is between about 0.001 to about 100 ohm·cm.

7. The method of claim 2, wherein the current to form the first porous layer is applied for a period of less than about two hours.

8. The method of claim 2, wherein the pores of the first porous layer are of a nm scale.

9. The method of claim 2, wherein a maximum increase in the magnitude of the current is from about 2 to about 4 to produce the second porous layer.

10. The method of claim 1, further comprising oxidizing the pores of the first porous layer prior to forming the epitaxial semiconductor layer.

11. The method of claim 10, wherein the oxidizing step is a dry oxidation at a temperature of about 350 to about 500 degrees C.

12. The method of claim 1, further comprising annealing the semiconductor wafer in an atmosphere conducive to reducing surface roughness.

13. The method of claim 12, wherein at least one of:
   the atmosphere is at least a hydrogen atmosphere; and
   a temperature of the annealing step is between about 900 to about 1250 degrees C.

14. The method of claim 12, further comprising introducing a silicon gas into the atmosphere during annealing.

15. The method of claim 14, wherein the atmosphere contains at least $SiH_4$.

16. The method of claim 1, wherein the epitaxial semiconductor layer is formed via one or more of: chemical vapor deposition, sputtering, e-beam evaporation, and thermal evaporation of silicon.

17. The method of claim 1, wherein pore sizes of the first porous layer are between about 2 to 5 nm, and pore sizes of the second porous layer are between about 10 to 20 nm.

18. The method of claim 1, further comprising:
   applying heating at least one of the glass substrate and the epitaxial semiconductor layer;
   bringing the glass substrate into direct or indirect contact with the epitaxial semiconductor layer; and
   applying a voltage potential across the glass substrate and the epitaxial semiconductor layer to induce the bond therebetween.

19. The method of claim 18, wherein the temperature of the glass substrate and the epitaxial semiconductor layer are elevated to within about 150 degrees C. of the strain point of the glass substrate.

20. The method of claim 18, wherein the voltage potential across the glass substrate and the epitaxial semiconductor layer is between about 100 to 2000 volts.

21. The method of claim 1, wherein the stress is induced by cooling the bonded glass substrate, epitaxial semiconductor layer, porous layers and semiconductor wafer such that a fracture occurs substantially at the first and second porous layers.

22. The method of claim 21, further comprising providing mechanical stress to facilitate the separation.

23. The method of claim 21, wherein the separation results in a structure including the glass substrate, the epitaxial semiconductor layer and at least a portion of the first porous layer.

24. The method of claim 23, further comprising polishing off the first porous layer to form the semiconductor on glass structure.

25. The method of claim 1, wherein the semiconductor of at least one of the semiconductor wafer and the epitaxial semiconductor layer is taken from the group consisting of: silicon (Si), germanium-doped silicon (SiGe), silicon carbide (SiC), germanium (Ge), gallium arsenide (GaAs), GaP, and InP.

26. A method of forming a semiconductor on glass structure, comprising:
    creating a porous layer in a semiconductor wafer using anodization;
    forming an epitaxial semiconductor layer directly or indirectly on the porous layer;
    bonding a glass substrate to the epitaxial semiconductor layer using electrolysis; and
    applying stress to at least the porous layer such that the bonded glass substrate and epitaxial semiconductor layer separates from the semiconductor wafer.

27. The method of claim 26, wherein pore sizes of the porous layer are about 6 to 9 nm.

* * * * *